United States Patent [19]

Crafts et al.

[11] Patent Number: 4,647,798

[45] Date of Patent: Mar. 3, 1987

[54] NEGATIVE INPUT VOLTAGE CMOS CIRCUIT

[75] Inventors: Harold S. Crafts; Patrick L. Ham, both of Fort Collins, Colo.

[73] Assignee: NCR Corporation, Dayton, Ohio

[21] Appl. No.: 723,016

[22] Filed: Apr. 15, 1985

[51] Int. Cl.[4] .................. H03K 19/094; H03K 19/20; H03K 3/353

[52] U.S. Cl. .................. 307/451; 307/448; 307/296 R; 307/297; 307/304

[58] Field of Search .......... 307/448, 450, 451, 296 R, 307/297, 304, 585, 576

[56] References Cited

U.S. PATENT DOCUMENTS

| | | | |
|---|---|---|---|
| 3,702,943 | 11/1972 | Heuner et al. | 307/362 |
| 4,259,686 | 3/1981 | Suzuki et al. | 307/296 A |
| 4,326,136 | 4/1982 | Le Can et al. | 307/451 |

Primary Examiner—Stanley D. Miller
Assistant Examiner—Timothy P. Callahan
Attorney, Agent, or Firm—Wilbert Hawk, Jr.; Casimer K. Salys; Edward Dugas

[57] ABSTRACT

A CMOS inverter circuit wherein the input device is formed with a p-well as the back-gate and is adapted to receive negative going input signals at the p-well. The gate of the input device is connected to a bias supply set just above the threshold for the input device. With the input signal voltage at 0, the inverter is on, and the output voltage is near 0. As the input signal voltage goes negative, the threshold of the input device increases due to the back-gate bias effect, and it turns off, causing the output voltage to go positive.

9 Claims, 11 Drawing Figures

NEGATIVE INPUT VOLTAGE CMOS CIRCUIT

BACKGROUND OF THE INVENTION

The invention relates to a CMOS circuit which is capable of responding to negative going input signals without the need of a negative power supply voltage.

Generally speaking, when a negative input signal is to be processed by a CMOS circuit, a negative supply voltage having a value somewhat more negative than the most negative expected threshold voltage is applied to the p-well and the source of the input device. That technique acts to place the device at a more negative reference than the incoming negative signal such that the incoming signal is positive with respect to the devices input threshold potential, similar to normally biased CMOS circuits.

A background patent of interest is U.S. Pat. No. 4,259,686 entitled, Circuit for Producing a Polarity-Reversed Voltage with Opposite Polarity To That of A Power Supply Voltage, by Y. Suzuki, et al. In the patent there is generally discussed, in the background of the invention, the state of the art regarding back-gate biasing as applied to MOS-FET devices and its affect upon the voltage threshold of the device. The circuit of that patent recognizes that the polarity of the back-gate bias must be opposite to that of the power supply voltage and therefore the circuitry, through means of a capacitor, transistor devices and input clocks, produces a polarity-reversed voltage opposite to that of the power supply to provide the back biasing potential.

Another patent of interest is U.S. Pat. No. 4,326,136 entitled, Threshold Circuit Using Complimentary Field Effect Transistors, by C. J. P. F. LeCan, et al. The circuit of the patent changes the threshold value of the standard fabricated CMOS device by the application of a direct voltage between the gate electrodes of the first and the second field-effect transistors. The applied direct voltage has the same polarity as the supply voltage and enables a smaller input signal swing to cause the output signal to change from one extreme value to the other extreme value. An optimal effect is achieved if the direct voltage between the gate electrodes is of the same order of magnitude as the supply voltage minus the sum of the threshold voltages of the first and the second field effect transistors.

SUMMARY OF THE INVENTION

In the broadest aspect of the invention, a CMOS circuit responsive to an input signal if formed from a substrate of a first impurity type. A well of second impurity type is formed in the substrate. A transistor of first impurity type having a gate electrode, a source electrode for connection to a reference potential, and a drain electrode is formed in the well. A load is provided for connecting the supply voltage to the drain electrode of the transistor. A biasing means is coupled to the gate electrode of the transistor for biasing the transistor to a value slightly greater than the transistor's threshold. An input electrode is coupled to the the well of the transistor for coupling input signals to the well. An output electrode is coupled to the drain electrode of the transistor.

In the preferred embodiment of the present invention, the circuit is comprised of a load which may be a first MOS transistor of a first conductivity type with, a gate electrode, a source electrode and a drain electrode, a second MOS transistor of a second complementary conductivity type with, a gate electrode, a source electrode and a drain electrode. A p-well is provided to separate the first MOS transistor from the second MOS transistor. The gate electrode of the first MOS transistor is adapted to be connected to a bias source having a value that is positive with respect to a reference potential (ground) and slightly greater than the threshold of the first MOS transistor, with the p-well being connected to receive input signals. An output terminal is connected to the drain electrode of the first and the second MOS device. In operation, the bias potential is set just above the threshold of the device such that when the input signal's voltage level is at 0, the first device is on and the output voltage is near 0. As the input signal's voltage level falls below 0, the threshold of the inverter increases due to the back-gate bias effect, and it turns off, causing the output voltage to rise.

This configuration thereby permits a negative input signal to be operated on by the CMOS device. The bias supply need not have the capability of delivering any large level of current due to the fact that it is attached to the gate of the first MOS device.

In a second embodiment of the invention, there is added to the preferred embodiment circuit a second CMOS circuit comprised of a third MOS transistor of the p-channel type and a fourth MOS transistor of the n-channel type. The n-channel transistor is connected as a diode with the p-channel transistor connected to the power source so as to act as a current source. The potential developed across the diode is coupled to the gate of the first MOS transistor to provide it with the bias potential which is just slightly higher than the threshold of the first transistor. This configuration automatically provides the bias necessary to enable the first CMOS circuit to respond to negative going input signals.

In a third embodiment of the invention, a hysteresis sensitivity is provided by adding to the circuitry of the second embodiment of the invention a fifth MOS transistor of the n-channel type wherein the drains and gates of the fourth and fifth transistors are connected together and the gate of the fifth transistor is connected to the output terminal so as to effect an altering of the bias supply voltage by the turning on of the fifth transistor. In operation, if the input signal is of a low voltage and the output of the input device is high, then turning on the fifth transistor will reduce the bias voltage. With the bias voltage reduced, the threshold of the input to the back-gate biased transistor will increase thereby creating the desired hysteresis effect in the circuit.

In a fourth embodiment of the invention, two of the preferred embodiment circuits are connected as a differential pair with the input signal being applied to the p-well of one of the devices. An operational amplifier is connected with its inputs across the output terminals of the respective devices. The output of the operational amplifier, aside from being the circuit output, is feedback to the p-well of the other device so as to control the bias potential.

In a fifth embodiment of the invention, the circuit of the fourth embodiment of the invention is modified by, not having the output of the differential amplifier fedback to the p-well of the other device. The p-well of the other device is instead connected to a source of constant voltage so as to form a device wherein the output voltage, taken from the output of the operational amplifier, will vary as the square root of the input voltage.

From the foregoing, it can be seen that it is a primary object of the present invention to provide a CMOS circuit which is responsive to negative input signals.

It is another object of the present invention to provide a CMOS circuit which is responsive to negative input signals without the need for a separate negative supply voltage.

It is a further object of the present invention to provide a CMOS circuit having a hysteresis characteristic which is responsive to negative input signals.

It is yet a further object of the present invention to provide a differential amplifier circuit utilizing CMOS devices which is responsive to negative input signals.

These and other objects of the present invention will become more apparent when taken in conjunction with the following description and drawings wherein like characters indicate like parts and which drawings form a part of the present application.

DETAILED DESCRIPTION OF THE INVENTION

Figure 1:
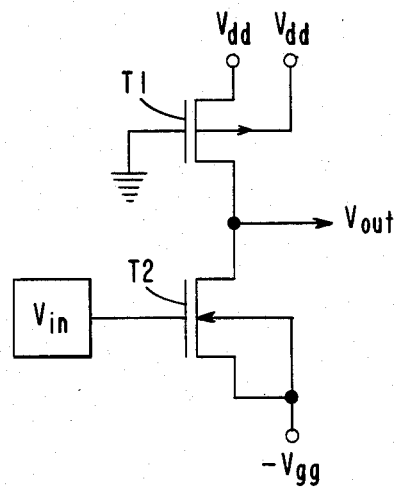
FIG. 1 is a schematic of a PRIOR ART CMOS inverter circuit that is responsive to negative inputs.

FIG. 1 shows a PRIOR ART CMOS inverter circuit with a p-channel field effect transistor T1 and an n-channel field-effect transistor T2. The gate of transistor T1 is connected to a reference potential (ground) with the gate of transistor T2 connected to a source of negative input signals denoted $V_{in}$. The drains of both transistors are connected to an output terminal, $V_{out}$. The p-well and the source of transistor T2 are connected to a negative supply voltage, $-V_{gg}$. The source and substrate of transistor T1 are connected to a supply voltage, $V_{dd}$. The CMOS device shown is an inverter circuit wherein the device is back biased so as to make the input signal positive with respect to the source and p-well of the device, to thereby maintain the positive voltage threshold relationship between the gate and the source. This particular arrangement requires that there be a second supply voltage namely the negative supply, $-V_{gg}$.

Figure 2:
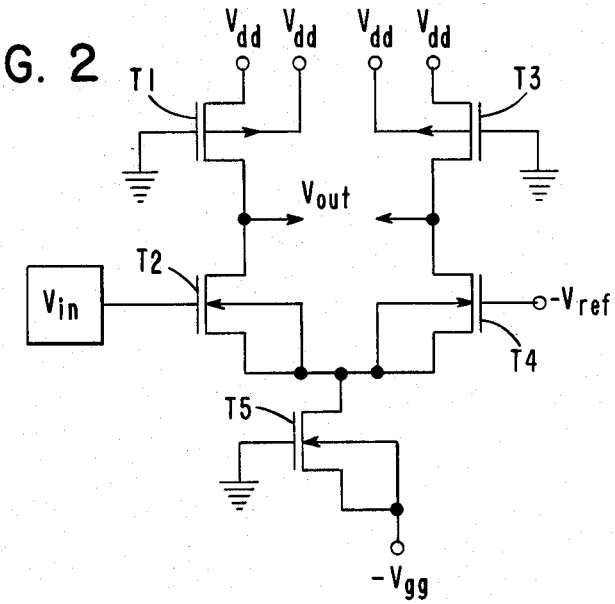
FIG. 2 is a schematic of a PRIOR ART CMOS circuit which is responsive to negative input signals.

Refer to FIG. 2, wherein there is shown another PRIOR ART CMOS circuit which is responsive to a negative input signal. The FIG. 2 embodiment is directed to a differential amplifier having the inverter transistors T1 and T2 configured according to the FIG. 1 embodiment with the source and p-well connected to the drain of a transistor T5. Transistor T5 has its gate connected to a reference potential (ground) and its source and p-well connected to the negative supply voltage, $-V_{gg}$. A second pair of inverter transistors, T3 and T4, are connected with the source and p-well of transistor T4 connected to the drain of transistor T5. The gate of transistor T4 is connected to the reference potential, $-V_{ref}$. The gate of transistor T3 is connected to the reference potential (ground) and the source and substrate are connected to the supply voltage, $V_{dd}$. In this instance, two negative voltages are provided, the $-V_{gg}$ supply and the $-V_{ref}$ voltage. With this configuration, the input inverter's threshold is positive with respect to the most negative supply voltage.

The circuits of FIG. 1 and FIG. 2 require a negative supply voltage to be connected to the circuit. The negative supply voltage requires an extra pin (pad) to be connected to the integrated circuit or an internal bias generator for generating the negative voltage.

Figure 3:
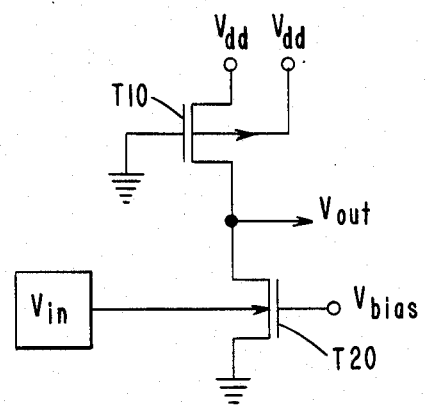
FIG. 3 illustrates in schematic form the preferred embodiment of the present invention, implemented in CMOS.

Referring to FIG. 3, wherein the preferred embodiment of the invention is shown, the CMOS inverter circuit is shown comprised of a p-channel field effect transistor T10 and an n-channel field effect transistor T20. The gate of transistor T10 is connected to a reference source (ground) and the source and substrate are connected to a power supply, $V_{dd}$. The source of transistor T20 is connected to the reference potential (ground) and the gate is connected to a bias supply, $V_{bias}$. The drain of transistors T10 and T20 are connected to an output terminal, $V_{out}$. The negative input signal, $V_{in}$, is connected to the p-well of transistor T20. In this configuration, the p-well forms the back-gate of the input inverter and changing its voltage alters the threshold of the inverter. The voltage, $V_{bias}$, is set just above the threshold of the inverter. When the input signal is at a voltage level of 0, the inverter is on and the voltage at the output is near 0. As the input signal goes more negative, the threshold of the inverter increases due to the back-gate bias effect and in turn turns off transistor T20 causing the output voltage, $V_{out}$, to rise. The circuit configuration of FIG. 3 does not require a negative power supply to provide a circuit that is responsive to negative input signals. Transistor T10 operates as a load for transistor T20. Other types of loads could be used without detracting from the invention. It is to be appreciated that transistor T20 could be an n-channel depletion transistor and that transistor T20 could be a p-channel transistor with an n-well biased so as to be responsive to positive input signals applied to its n-well.

Figure 4:
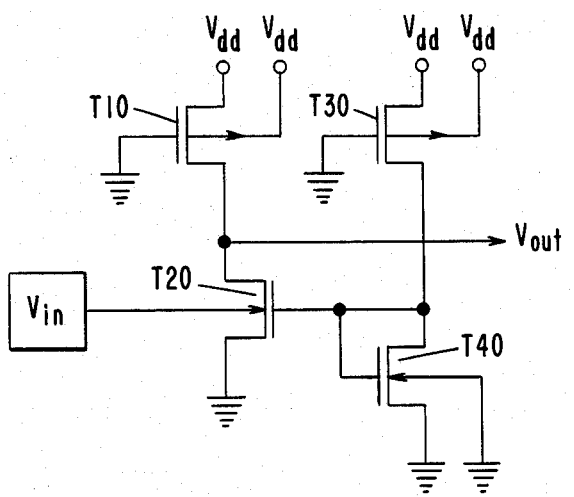
FIG. 4 illustrates in schematic form a second embodiment of the present invention.

Referring now to FIG. 4, wherein a second embodiment of the invention is shown comprised of additional circuitry for generating the biasing voltage, $V_{bias}$. An additional p-channel field effect transistor T30 and an n-channel field effect transistor T40 are shown connected with their drains coupled to the gate of transistor T20 and to the gate of transistor T40. The gate of transistor T30 is connected to the reference potential (ground) as is the source and substrate of transistor T40. Effectively, transistor T40 is connected as a diode and transistor T30 is connected as a source of current. The current passing through transistor T40 produces a voltage drop somewhat higher than the threshold voltage of the transistor T20. With this bias voltage applied to the gate of transistor T20, it will turn on and draw current through transistor T10. The operation of the circuit, in response to the negative input signal, $V_{in}$, is identical to the operation of the circuit shown in FIG. 3.

Figure 5:
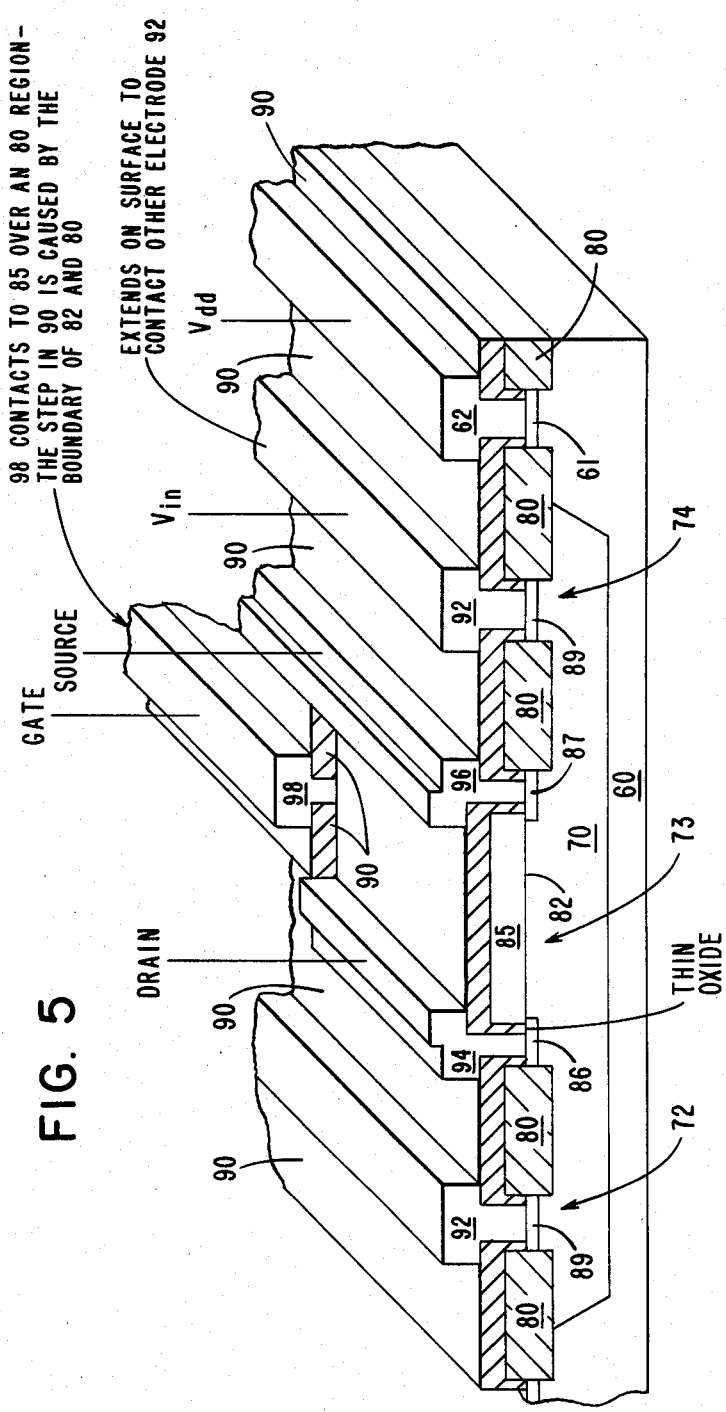
FIG. 5 illustrates in prospective cross-sectional view the construction of a CMOS device in accord with the present invention.

Referring to FIG. 5 which is a perspective cross-sectional view of a device configured with the input connected to the p-well. The device is equivalent to transistor T20, and is fabricated using standard well-know fabrication techniques. A substrate 60 fabricated from monocrystallene silicon, lightly doped with an N-dopant, has deposited on the upper surface thereof an N+ layer 61. The N+ layer provides an electrical transition zone for a metalic contact 62. The metalic contact connects to the positive supply, Vdd (See backgate to transistor T10). A p-well 70 is formed in substrate 60 and is lightly doped with a p-type dopant. The p-well 70 is partitioned into three major device areas 72, 73, and 74 by thick field oxide areas 80. A thin layer of silicon dioxide 82 is deposited on the surface of the p-well. A polycrystallene silicon gate electrode 85 is affixed to the layer 82. N+ type impurity regions 86 and 87 form the drain and source, respectively.

A P+ type surface 89 is placed on the p-well 70 in areas 72 and 74 in order to provide electrical contact for the metal electrodes 92. Prior to depositing the metal contact portions of the device there is deposited a thick insulating layer 90, made of, for example, phosphosilicate glass, which functions to electrically isolate the metal electrodes. A drain electrode 94, a source electrode 96, and a gate electrode 98 are deposited so as to make electrical contact with the N+ surface 86, the N+ surface 87 and the polycrystallene gate 85, respectively.

Although one particular device structure has been shown to meet the best-mode disclosure requirements, it is to be understood that other variations of the structure, falling under the scope of the claims, are possible.

Figure 6:
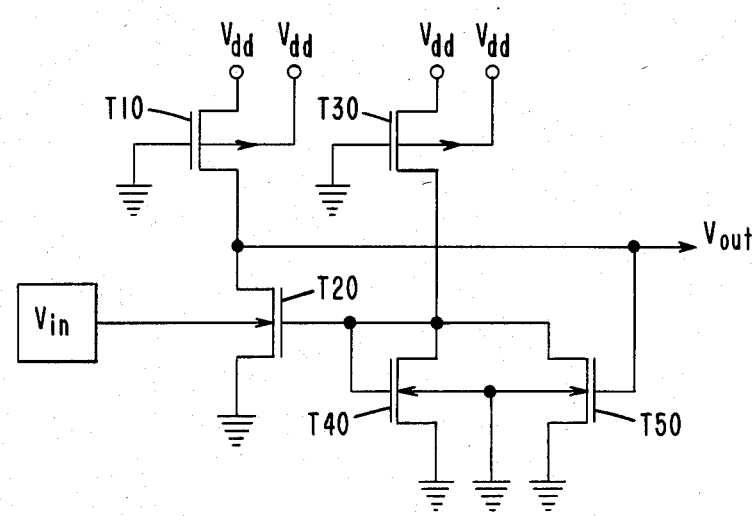
FIG. 6 illustrates in schematic form a third embodiment of the present invention.

Referring now to FIG. 6 wherein is shown a third embodiment of the invention, which embodiment is particularly useful when there is a need to provide some hysteresis in the input circuit, for example, when it is necessary to reduce the sensitivity of the input to noise. The circuit is identical to that disclosed in FIG. 4 with the addition of a transistor T50, having its drain connected to the drain of transistors T30 and T40 and its source connected to a reference potential (ground) along with the back-gate. The gate of transistor T50 is connected to the voltage output terminal, $V_{out}$. In operation, the bias supply is altered by turning on transistor T50. If the input voltage $V_{in}$ is low, and the output of the inverter is high, then turning on transistor T50 will reduce the bias voltage. With the bias voltage reduced, the threshold of the input inverter, due to the back-gate bias voltage, will increase which in turn will cause the transistor to turn on with a less negative potential input signal.

Figure 7:
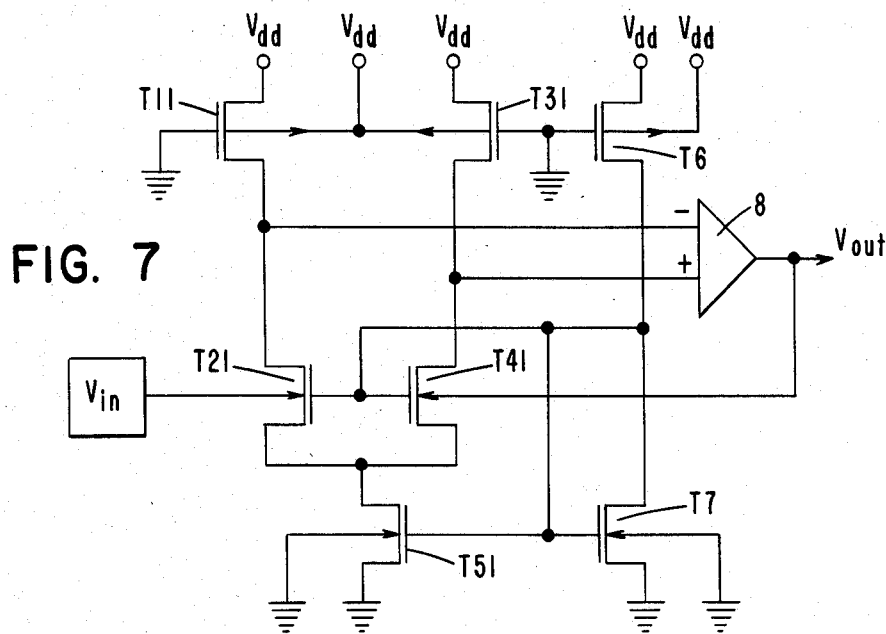
FIG. 7 illustrates in schematic form a fourth embodiment of the present invention.

Referring now to FIG. 7 wherein a fourth embodiment of the invention is shown, with two inverter circuits comprised of transistors T11, T21, T31 and T41 connected as a differential pair with the sources of transistors T21 and T41, connected to the drain of transistor T51. The source and back-gate of transistor T51 are connected to the reference potential (ground). A p-channel transistor, T6, and an n-channel transistor, T7, are connected in the circuit with their drains connected to the gates of transistors, T21 and T41, and to the gates of transistors, T51 and T7. The gate of transistor T6 is connected to the reference potential (ground) and the p-well is connected to the potential source, $V_{dd}$. The source of transistor T7 and the p-well are connected to the reference potential. The inputs to a differential amplifier 8 are taken from the drain of transistors, T11 and T21, and the drain of transistors, T31 and T41. The output of the amplifier 8 is the signal, $V_{out}$, which signal is also fed back to the p-well of transistor T41. The circuit of FIG. 7 is responsive to negative $V_{in}$ signals.

Figure 8:
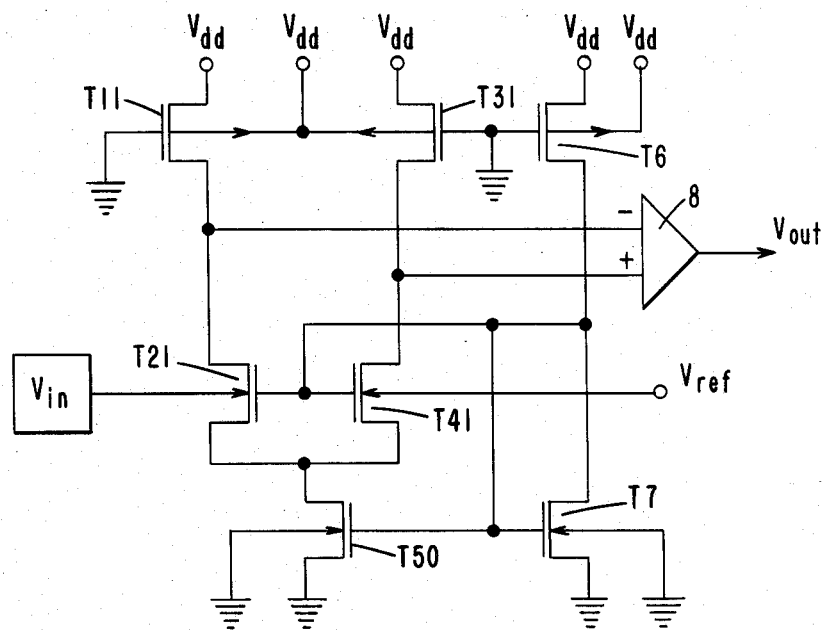
FIG. 8 illustrates in circuit schematic diagram form a fifth embodiment of the present invention.
Figure 9:
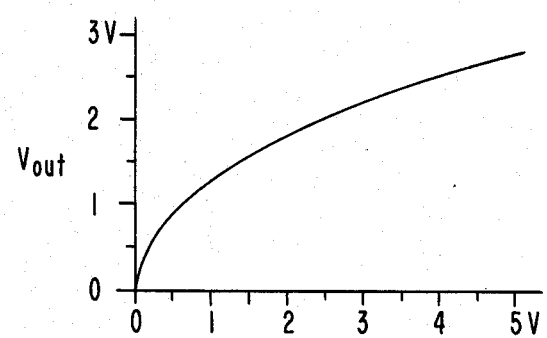
FIG. 9 is a graph illustrating the operating characteristics of the fifth embodiment of the invention.

Referring now to FIG. 8 wherein a fifth embodiment of the invention is shown utilizing the circuitry of FIG. 7, with the exception that the output, $V_{out}$, from the amplifier 8 is not fedback to the p-well of transistor T41. The p-well of transistor T41 is instead connected to a source of reference voltage, $V_{ref}$. The novel feature of the FIG. 8 circuit is its input vs. output characteristics which are shown in FIG. 9. With the transistor threshold varying as the square root of the back gate bias voltage, the output voltage, $V_{out}$, will vary as the square root of the input voltage, $V_{in}$, as is shown in the curve plot of FIG. 9.

Figure 10:
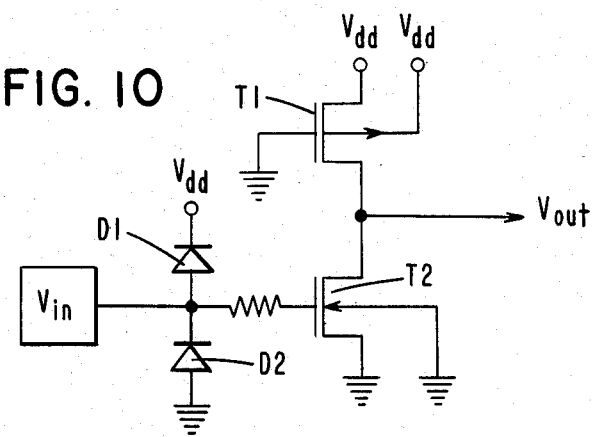
FIG. 10 illustrates a PRIOR ART circuit for protecting circuits.
Figure 11:
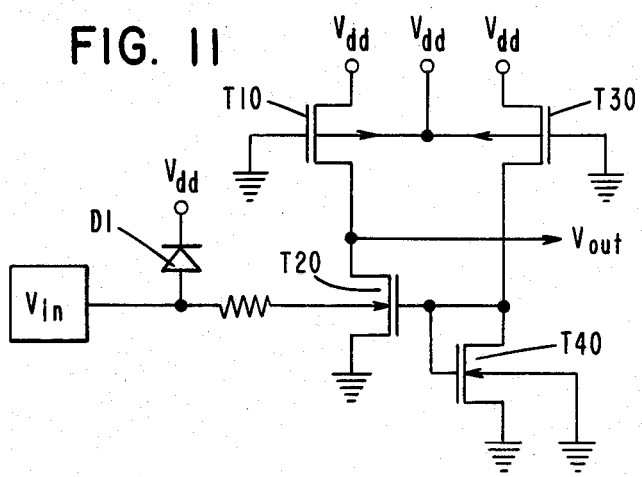
FIG. 11 illustrates a circuit configuration for protecting the circuit embodiments of the present invention.

Referring to the PRIOR ART CMOS circuit of FIG. 10, diodes D1 and D2 along with the current limiting resistor provide input protection. With the input signal, $V_{in}$, being negative, the standard dual diode protection techniques will not work. The diode D2 will become forward biased when the input signal goes negative, which will clamp the input gate at one threshold drop. This problem is solved by connecting one diode to the circuit of FIG. 4 as is shown in FIG. 11. The removal of the diode D2, of the FIG. 10 circuit, enables the diode D1 to provide negative protection by avalanching when the signal $V_{in}$ is of a magnitude which would cause damage. This same diode protection can be used on the input of each of the disclosed embodiments.

While there has been shown what is considered to be the preferred embodiments of the present invention, it will be manifest that many changes and modifications may be made therein without departing from the essential spirit of the invention. For example, the conductivity type of the various transistors shown could be changed to the opposite conductivity type and the input signal would then be applied to an n-well. It is intended, therefore, in the annexed claims, to cover all such changes and modifications as may fall within the true scope of the invention.

We claim:

1. A CMOS circuit responsive to input signals comprising:
    a substrate of first impurity type,
    a well of second impurity type formed in said substrate;
    a transistor of first impurity type having a gate electrode, a source electrode for connection to a reference potential and a drain electrode formed in said well;
    a load for connecting a supply voltage to the drain electrode of said transistor;
    biasing means coupled to the gate electrode of said transistor for biasing said transistor to a value slightly greater than its threshold;
    input electrode means coupled to the well of said transistor for coupling input signals to said well; and
    an output electrode coupled to the drain electrode of said transistor.

2. A CMOS circuit responsive to input signals according to claim 1 wherein said load is comprised of;
    a transistor of second conductivity type having a source electrode, a drain electrode, and a gate electrode, said gate electrode connected to the reference potential, said transistor connecting the supply voltage to the drain electrode of the transistor of first impurity type through its source and drain electrodes.

3. A CMOS circuit responsive to negative input signals comprising:
   a load for connection to a supply voltage;
   a second transistor of n-channel type having a source electrode for connection to a reference potential, a drain electrode, a gate electrode, and an associated p-well;
   biasing means coupled to the gate electrode of said second transistor for biasing said second transistor to turn off upon receipt of negative input signals;
   input electrode means coupled to the p-well of said second transistor for coupling negative going input signals to said p-well; and
   an output electrode electrically coupled to the supply voltage through said load and to the drain electrode of voltage said second transistor.

4. A CMOS circuit responsive to negative input signals comprising:
   a first transistor of p-channel type having a source electrode for connection to a supply voltage, a drain electrode, a gate electrode for connection to a reference potential;
   a second transistor of n-channel type having a source electrode for connection to the reference potential, a drain electrode electrode, a gate electrode, and an associated p-well;
   biasing means coupled to the gate electrode of said second transistor for biasing said second transistor to turn off upon receipt of negative input signals;
   input electrode means coupled to the p-well of said second transistor for coupling negative going input signals to said p-well; and
   an output electrode electrically coupled to the drain electrode of said first transistor and said second transistor.

5. A CMOS circuit according to claim 4 wherein said biasing means is comprised of:
   a third transistor of p-channel type having a source electrode for connection to the supply voltage, a drain electrode, and a gate electrode for connection to the reference potential; and
   a fourth transistor of n-channel type having a source electrode for connection to the reference potential, a drain electrode coupled to the drain electrode of said third transistor and the gate electrode of said second transistor, a gate electrode connected to said drain electrode, and an associated p-well for connection to the reference potential.

6. A CMOS circuit according to claim 5 and further comprising:
   a fifth transistor of n-channel type having a source electrode for connection to the reference potential, a drain electrode coupled to the drain electrode of said fourth transistor, a gate electrode connected to said output electrode, and an associated p-well for connection to the reference potential.

7. A CMOS circuit responsive to negative input signals comprising:
   a first transistor of p-channel type having a source electrode for connection to a supply voltage, a drain electrode, a gate electrode for connection to a reference potential, and a substrate electrode for connection to the supply voltage;
   a second transistor of n-channel type having a source, a drain electrode connected to the drain electrode of said first transistor, a gate electrode, and an associated p-well;
   a third transistor of p-channel type having a source electrode for connection to a supply voltage, a drain electrode, a gate electrode for connection to a reference potential, and a substrate electrode for connection to the supply voltage;
   a fourth transistor of n-channel type having a source electrode connected to the source electrode of said second transistor, a drain electrode connected to the drain electrode and said third transistor, a gate electrode connected to the gate electrode of said second transistor, and an associated p-well;
   a fifth transistor of n-channel type having a source electrode for connection to the reference potential, drain electrode connected to the source electrodes of said second and said fourth transistors, a gate electrode, and an associated p-well for connection to the reference potential;
   a sixth transistor of p-channel type having a source electrode for connection to a supply voltage, a drain electrode connection to the gates of said second and fourth transistors, a gate electrode for connection to the reference potential, and a substrate electrode for connection to the supply voltage;
   a seventh transistor of n-channel type having a source electrode for connection to the reference potential, a drain electrode coupled to the drain electrode of said sixth transistor, the gate electrodes of said second and said fourth transistors, a gate electrode coupled to the gate electrode of said fifth and said fourth transistors, and an associated p-well for connection to the reference potential;
   an operational amplifier having a first input connected to the drain of said second transistor, a second input connected to the drain of said fourth transistor and an output said output fed back to the p-well of said fourth transistor; and
   input electrode means coupled to the p-well of said second transistor for coupling negative going input signals to said p-well, the output of said circuit being taken from the output of said operational amplifier.

8. A CMOS circuit according to claim 7 wherein the output of said operational amplifier is not fed back to the p-well of said fourth transistor and the p-well of said fourth transistor is connectable to a source of bias voltage.

9. A CMOS circuit according to claim 4 and further comprising:
   a diode connected between the supply voltage and said input electrode means for avalanching when the potential at said input electrode means goes positive with respect to the supply voltage.

* * * * *